(12) United States Patent
Gwon et al.

(10) Patent No.: US 10,976,877 B2
(45) Date of Patent: Apr. 13, 2021

(54) DISPLAY DEVICE HAVING TOUCH SENSOR

(71) Applicant: LG DISPLAY CO., LTD., Seoul (KR)

(72) Inventors: Hyang-Myoung Gwon, Paju-si (KR); Ji-Hyun Jung, Paju-si (KR); Ru-Da Rhe, Seoul (KR); Jae-Gyun Lee, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 16/515,820

(22) Filed: Jul. 18, 2019

(65) Prior Publication Data

US 2020/0026390 A1 Jan. 23, 2020

(30) Foreign Application Priority Data

Jul. 19, 2018 (KR) .......................... 10-2018-0084292

(51) Int. Cl.
*G06F 3/044* (2006.01)
*G06F 3/041* (2006.01)
*H01L 27/32* (2006.01)

(52) U.S. Cl.
CPC .......... *G06F 3/0443* (2019.05); *G06F 3/0412* (2013.01); *H01L 27/323* (2013.01); *H01L 27/3272* (2013.01); *G06F 2203/04103* (2013.01)

(58) Field of Classification Search
CPC ............................................. G06F 3/044–0448
See application file for complete search history.

(56) References Cited

U.S. PATENT DOCUMENTS

| 2011/0193793 | A1* | 8/2011 | An .................. G06F 3/0445 345/173 |
| 2012/0081328 | A1* | 4/2012 | Kandziora .............. G06F 3/044 345/174 |
| 2016/0132148 | A1 | 5/2016 | Han et al. |
| 2017/0003778 | A1* | 1/2017 | Shepelev .............. G06F 3/0414 |
| 2018/0095571 | A1* | 4/2018 | Park ...................... H01L 27/323 |

FOREIGN PATENT DOCUMENTS

| EP | 3336667 A1 | 6/2018 |
| EP | 3343336 A1 | 7/2018 |

* cited by examiner

*Primary Examiner* — Hang Lin
(74) *Attorney, Agent, or Firm* — Birch, Stewart, Kolasch & Birch LLP (57) ABSTRACT

The present disclosure provides a display device having a touch sensor for securing improved touch-sensing performance. The display device having a touch sensor includes a shield electrode and a touch electrode, which are sequentially disposed on an encapsulation unit covering a light-emitting element. While a touch-driving signal is applied to the touch electrode, a load free driving signal of which at least one of the phase or the amplitude is the same as that of the touch-driving signal is supplied to the shield electrode, thereby securing improved touch-sensing performance.

15 Claims, 9 Drawing Sheets

DISPLAY DEVICE HAVING TOUCH SENSOR

CROSS-REFERENCE TO RELATED APPLICATION

This application claims the priority benefit of Korean Patent Application No. 10-2018-0084292, filed in the Republic of Korea on Jul. 19, 2018, the disclosure of which is incorporated herein by reference.

BACKGROUND OF THE INVENTION

Field of the Invention

The present invention relates to a display device, and more particularly to a display device having a touch sensor for securing improved touch-sensing performance.

Discussion of the Related Art

A touch sensor is an input device through which a user can input a command by selecting instructions displayed on a screen of a display device using a hand or an object. That is, the touch sensor converts a contact position that directly contacts a human hand or an object into an electrical signal and receives selected instructions based on the contact position as an input signal. Such a touch sensor can substitute for a separate input device that is connected to a display device and operated, such as a keyboard or a mouse, and thus the range of application of the touch sensor has continually increased.

In the case in which a touch sensor is disposed on a display device, parasitic capacitance is formed at a region at which the conductive layers of the display device and the touch sensor overlap each other. This parasitic capacitance increases a touch-driving load and deteriorates touch-sensing accuracy. In particular, the shorter the distance between the conductive layer of the display device and the touch sensor, the larger the parasitic capacitance, which makes it difficult to ensure touch-sensing performance.

SUMMARY OF THE INVENTION

The present invention is directed to a display device having a touch sensor that substantially obviates one or more problems due to limitations and disadvantages of the related art.

An object of the present invention is to provide a display device having a touch sensor for securing improved touch-sensing performance.

Additional advantages, objects, and features of the invention will be set forth in part in the description which follows and in part will become apparent to those having ordinary skill in the art upon examination of the following or can be learned from practice of the invention. The objectives and other advantages of the invention can be realized and attained by the structure particularly pointed out in the written description and claims hereof as well as the appended drawings.

To achieve these objects and other advantages and in accordance with the purpose of the invention, as embodied and broadly described herein, a display device having a touch sensor includes a shield electrode and a touch electrode, which are sequentially disposed on an encapsulation unit covering a light-emitting element. While a touch-driving signal is applied to the touch electrode, a load free driving signal of which at least one of the phase or the amplitude is the same as that of the touch-driving signal is supplied to the shield electrode, thereby securing improved touch-sensing performance.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Reference will now be made in detail to exemplary embodiments of the present invention, examples of which are illustrated in the accompanying drawings. Wherever possible, the same reference numbers will be used throughout the drawings to refer to the same or like parts.

Figure 1:
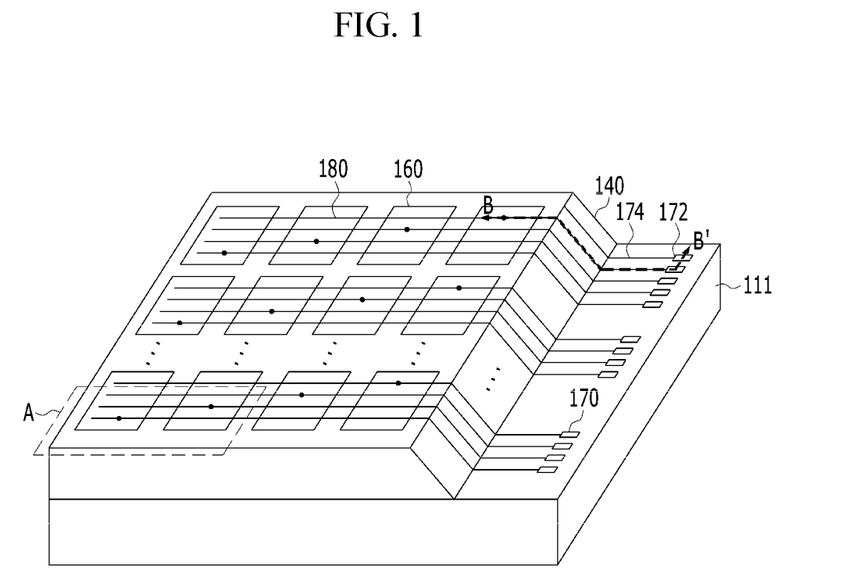
FIG. 1 is a perspective view illustrating a display panel having a touch sensor according to an example of the present invention.
Figure 2:
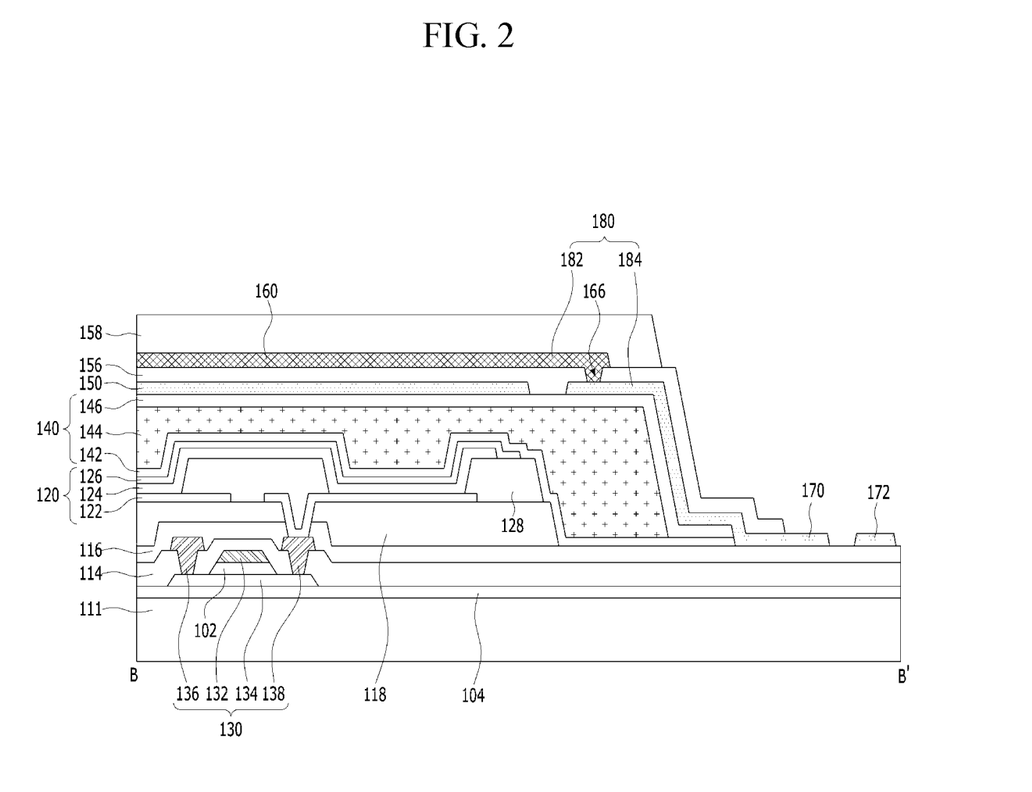
FIG. 2 is a cross-sectional view taken along line B-B' in the display device having a touch sensor illustrated in FIG. 1 in detail.

FIG. 1 is a perspective view illustrating an organic light-emitting display device having a touch sensor according to an example of the present invention, and FIG. 2 is a cross-sectional view illustrating the organic light-emitting display device having a touch sensor illustrated in FIG. 1. All the components of the organic light-emitting display device having the touch sensor according to all embodiments of the present invention are operatively coupled and configured.

The organic light-emitting display device having the touch sensor illustrated in FIGS. 1 and 2 includes a plurality of subpixels arranged in a matrix form on a substrate 111, an encapsulation unit 140 disposed on the subpixels, a touch electrode 160 disposed on the encapsulation unit 140, and a shield electrode 150 disposed between the encapsulation unit 140 and the touch electrode 160.

The organic light-emitting display device having the touch sensor comprises an active area disposed on the substrate 111 and a non-active area disposed adjacent to the active area. The substrate 111 is formed of a flexible material such as plastic or glass so as to be foldable or bendable. For example, the substrate 111 is formed of polyimide (PI), polyethylene terephthalate (PET), polyethylene naphthalate (PEN), polycarbonate (PC), polyethersulfone (PES), polyacrylate (PAR), polysulfone (PSF), or cyclic-olefin copolymer (COC).

The active area displays an image through unit pixels arranged in a matrix form. Each unit pixel includes red, green and blue subpixels, or includes red, green, blue, and white subpixels.

Each of the subpixels includes, as illustrated in FIGS. 1 and 2, a pixel-driving circuit, including a plurality of thin-film transistors 130, and a light-emitting element 120 connected to the pixel-driving circuit.

Each of the driving thin-film transistors 130 included in the pixel-driving circuit controls the current supplied from a high-voltage supply line to the light-emitting element 120 in response to a data signal supplied to a gate electrode of the corresponding driving thin-film transistor 130, thus adjusting the amount of light emitted from the light-emitting element 120.

Such a driving thin-film transistor 130, as illustrated in FIG. 2, includes a semiconductor layer 134 disposed on a buffer layer 104, a gate electrode 132 overlapping the semiconductor layer 134 with a gate insulation film 102 interposed therebetween, and source and drain electrodes 136 and 138 formed on an interlayer insulation film 114 so as to come into contact with the semiconductor layer 134. Here, the semiconductor layer 134 is formed of at least one of an amorphous semiconductor material, a polycrystalline semiconductor material, or an oxide semiconductor material.

The light-emitting element 120 includes an anode 122, at least one light-emitting stack 124 formed on the anode 122, and a cathode 126 formed on the light-emitting stack 124.

The anode 122 is electrically connected to the drain electrode 138 of the driving thin-film transistor 130, which is exposed through a pixel contact hole penetrating a protective film 116 and a pixel planarization layer 118.

The light-emitting stack 124 is formed on the anode 122 in a light-emitting area that is defined by a bank 128. The light-emitting stack 124 is formed by stacking a hole-related layer, an organic emission layer, and an electron-related layer on the anode 122 in that order or in the reverse order. In addition, the light-emitting stack 124 can include first and second light-emitting stacks, which face each other with a charge generation layer interposed therebetween. In this case, the organic emission layer of any one of the first and second light-emitting stacks generates blue light, and the organic emission layer of the other one of the first and second light-emitting stacks generates yellow-green light, whereby white light is generated via the first and second light-emitting stacks. Since the white light generated in the light-emitting stack 124 is incident on a color filter located above or under the light-emitting stack 124, a color image can be realized. In addition, colored light corresponding to each subpixel can be generated in each light-emitting stack 124 in order to realize a color image without a separate color filter. That is, the light-emitting stack 124 of the red subpixel can generate red light, the light-emitting stack 124 of the green subpixel can generate green light, and the light-emitting stack 124 of the blue subpixel can generate blue light.

The cathode 126 is formed so as to face the anode 122 with the light-emitting stack 124 interposed therebetween and is connected to a low-voltage supply line.

The encapsulation unit 140 can prevent external moisture or oxygen from permeating the light-emitting element 120, which is vulnerable to external moisture or oxygen. To this end, the encapsulation unit 140 includes at least one inorganic encapsulation layer 142 and at least one organic encapsulation layer 144. In the examples of the present invention, the structure of the encapsulation unit 140 in which the first inorganic encapsulation layer 142, the organic encapsulation layer 144 and the second inorganic encapsulation layer 146 are stacked in that order will be described by way of example.

The first inorganic encapsulation layer 142 is formed on the substrate 111, on which the cathode 126 has been formed. The second inorganic encapsulation layer 146 is formed on the substrate 111, on which the organic encapsulation layer 144 has been formed, so as to cover the upper surface, the lower surface and the side surface of the organic encapsulation layer 144 together with the first inorganic encapsulation layer 142.

The first and second inorganic encapsulation layers 142 and 146 minimize or prevent the permeation of external moisture or oxygen into the light-emitting stack 124. Each of the first and second inorganic encapsulation layers 142 and 146 is formed of an inorganic insulation material that is capable of being deposited at a low temperature, such as silicon nitride (SiNx), silicon oxide (SiOx), silicon oxide nitride (SiON), or aluminum oxide ($Al_2O_3$). Thus, since the first and second inorganic encapsulation layers 142 and 146 are deposited in a low-temperature atmosphere, it is possible to prevent damage to the light-emitting stack 124, which is vulnerable to a high-temperature atmosphere, during the process of depositing the first and second inorganic encapsulation layers 142 and 146.

The organic encapsulation layer 144 serves to dampen the stress between the respective layers due to bending of the organic light-emitting display device and to increase planarization performance. The organic encapsulation layer 144 is formed on the substrate 111, on which the first inorganic encapsulation layer 142 has been formed, using a non-photosensitive organic insulation material, such as PCL, acrylic resin, epoxy resin, polyimide, polyethylene or silicon oxycarbide (SiOC), or using a photosensitive organic insulation material such as photoacryl. The organic encapsulation layer 144 is disposed in the active area, rather than the non-active area.

A plurality of touch electrodes 160 is disposed above the active area of the encapsulation unit 140. Since each of the touch electrodes 160 includes a capacitance array formed in the corresponding touch electrode 160 itself, the touch sensor can be used as a self-capacitance-type touch sensor that senses variation in capacitance due to a user touch. In this self-capacitance sensing method using the touch electrodes 160, when a driving signal supplied through the touch pad 170 is applied to the touch electrodes 160 through routing lines 180, electric charges Q are accumulated in the touch sensor. At this time, when a user's finger or a conductive object touches the touch electrodes 160, parasitic capacitance is also sensed by a self-capacitance sensor, whereby a capacitance value varies. Therefore, it is possible to determine the presence or absence of a touch based on variation in the capacitance value between the touch sensor that is touched by the finger and the touch sensor that is not touched by the finger.

To this end, the touch electrodes 160 are configured as individual pieces that are divided in first and second directions that intersect each other. Each of the touch electrodes 160 is formed to have a size corresponding to a plurality of subpixels in consideration of a touch area of a user. For example, one touch electrode 160 has a size that is from several times to several hundred times larger than the size of one subpixel.

Each of the touch electrodes 160 is formed in a single-layer or multi-layer structure using a transparent conductive film formed of ITO, IZO, IGZO, or ZnO or using an opaque conductive film formed of opaque metal having high corrosion resistance and acid resistance and excellent conductivity, such as, for example, Ta, Ti, Cu, or Mo. When the touch electrodes 160 are formed of opaque metal, the touch electrodes 160 are formed in a mesh shape that does not overlap the emission area but overlaps the bank 128, thereby preventing an aperture ratio and transmissivity from being lowered by the touch electrodes 160. Since the mesh-shaped touch electrodes 160 have higher conductivity than a transparent conductive film, the touch electrodes 160 can be configured as low-resistance electrodes. Thereby, the resistance and capacitance of the touch electrodes 160 can be reduced, and the RC time constant can be reduced, which can result in increased touch sensitivity.

Each of the routing lines 180, which is connected to a respective one of the touch electrodes 160 in a one-to-one correspondence manner, is formed in any one of a first direction and a second direction. The first direction can be a vertical direction, and the second direction can be a horizontal direction perpendicular to the vertical direction.

In the active area, the routing lines 180, which cross the touch electrodes 160, are disposed so as to overlap the bank 128, thereby preventing the aperture ratio from being lowered by the routing lines 180.

In the non-active area, the routing lines 180 are disposed on the upper surface and the side surface of the second inorganic encapsulation layer 146, which is the uppermost layer of the encapsulation unit 140. Thus, even when external oxygen or moisture permeates through the routing lines 180, the oxygen or moisture is blocked by the organic encapsulation layer 144 and the first and second inorganic encapsulation layers 142 and 146, thereby protecting the light-emitting stack 124 from the oxygen or moisture.

Figure 3:
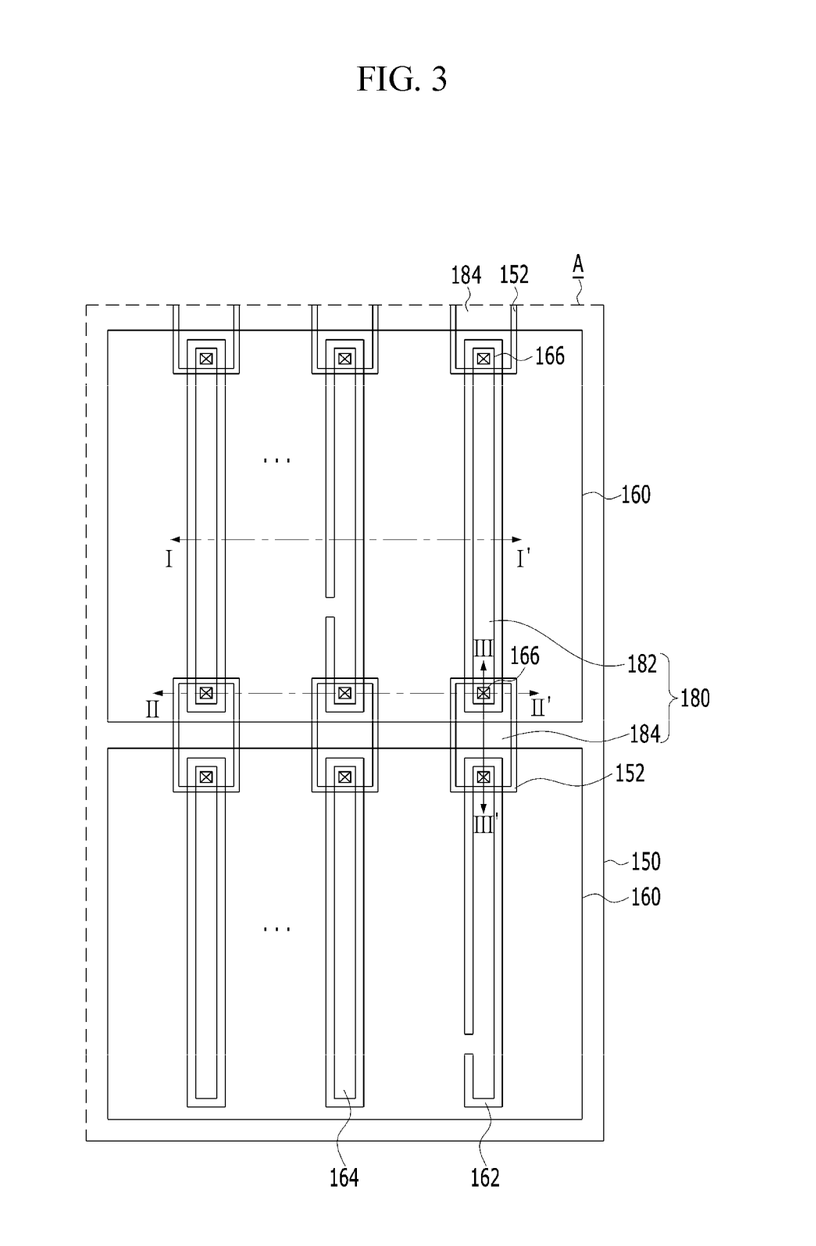
FIG. 3 is a plan view illustrating region A illustrated in FIG. 1 in detail.
Figure 4:
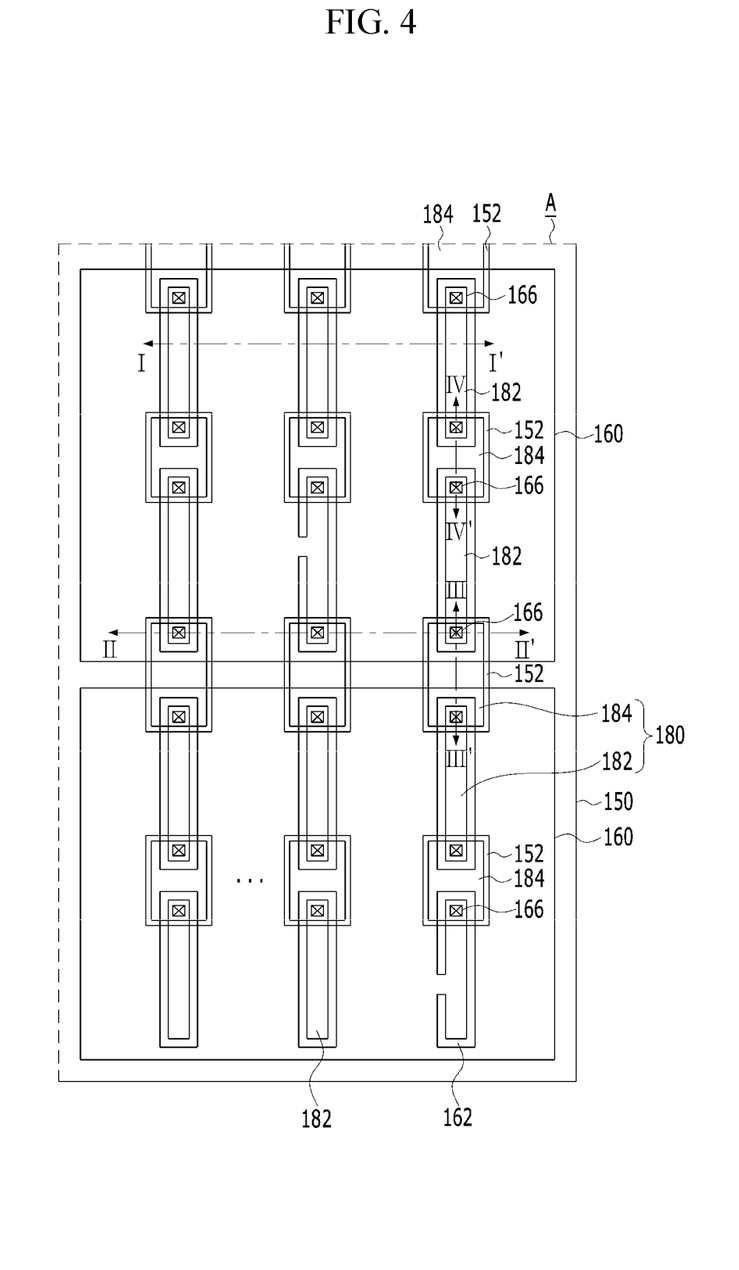
FIG. 4 is a plan view illustrating another example of region A illustrated in FIG. 1 in detail.

As illustrated in FIGS. 3 and 4, each of the routing lines 180 includes first and second routing lines 182 and 184, which are electrically connected to each other via routing contact holes 166. As shown in FIG. 2, a portion of the touch insulation film 156 and the second routing lines 184 are both disposed on the side surface of the encapsulation unit 140 and extend to a pad area of the display device. The touch insulation film 156 serves to protect the second routing lines 184 on the side surface from external moisture or oxygen, for example, due to the touch insulation film 156 covering the second routing lines 184 on the side surface, as shown in FIG. 2.

As shown in FIG. 2, the first routing lines 182 and the touch electrode 160 are on a same plane or layer, and the second routing lines 184 and the shield electrode 150 are formed on a same plane or layer. In other words, the first routing lines 182 and the touch electrode 160 are formed as part of the same layer, and the second routing lines 184 and the shield electrode 150 are also formed as part of the same layer. The touch electrode 160 and the first routing lines 182 are disposed in contact with the touch insulation film 156, and the second routing lines 184 and the shield electrode 150 are disposed in contact with the inorganic encapsulation layer 146.

Figure 5A:
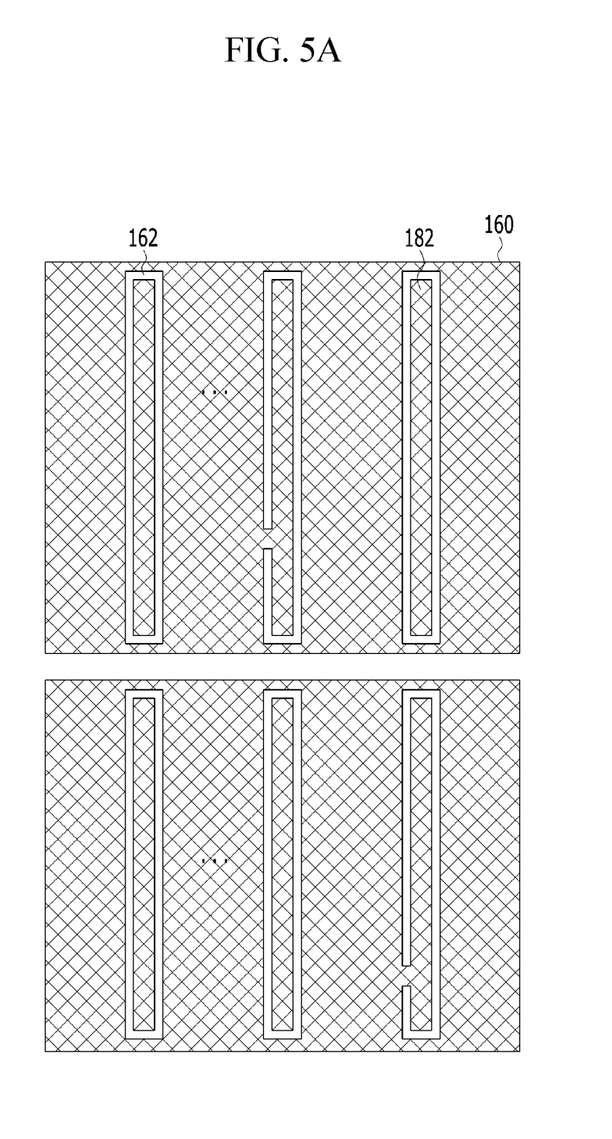
FIG. 5A is a plan view illustrating the arrangement relationship between a touch electrode and a first routing line illustrated in FIG. 3.
Figure 6A:
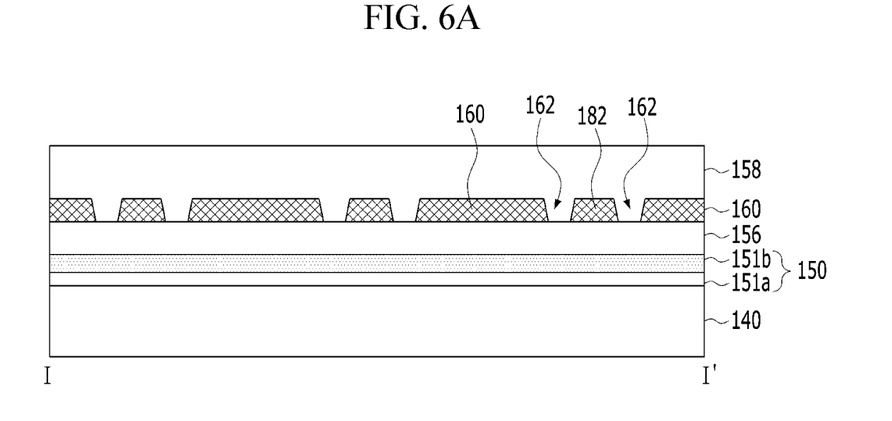
FIG. 6A is a cross-sectional view taken along line I-I' in the display device having a touch sensor illustrated in FIGS. 3 and 4.

A plurality of first routing lines 182 is disposed so as to be spaced apart from each other in a longitudinal (length) direction of each routing line 180. Each of the first routing lines 182, as illustrated in FIGS. 5A and 6A, is formed of the same material as the touch electrodes 160 on a touch insulation film 156, and is coplanar with the touch electrodes 160. Thus, the first routing lines 182, which are formed so as to be surrounded by the touch electrodes 160, are disposed so as to be spaced apart from the touch electrodes 160, with a first separation hole 162 therebetween. The first separation hole 162 can be formed around substantially all or at least some of the perimeter of a first routing line 182, as shown in FIG. 5A for example.

Here, among a plurality of routing lines 182, which extend across the $k^{th}$ (where k is a natural number) touch electrode 160, a first routing line 182, which is connected to the $k^{th}$ touch electrode 160, is directly connected to the corresponding touch electrode 160 without a separate contact hole, as illustrated by the top middle first routing line 182 in FIG. 5A. A first routing line 182, which is not directly connected to the $k^{th}$ touch electrode 160, is disposed so as to be spaced apart from the corresponding touch electrode 160, with the first separation hole 162 therebetween, as illustrated in the top leftmost and top rightmost first separation holes 162 of FIG. 5A.

Figure 5B:
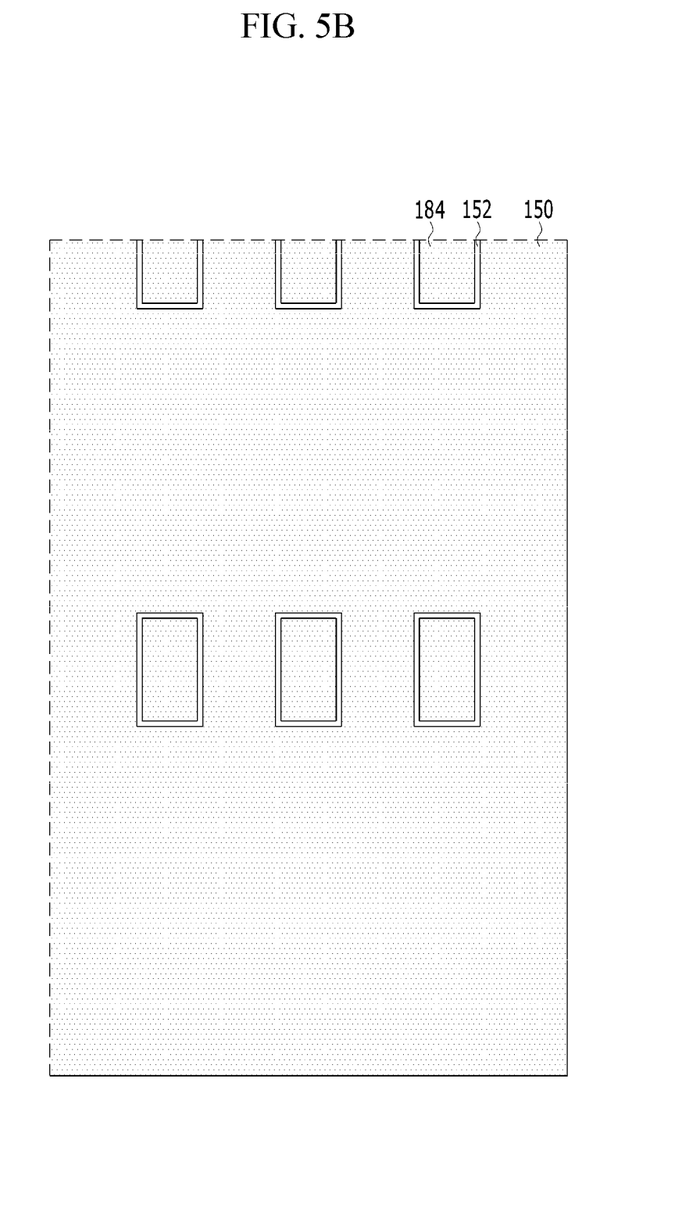
FIG. 5B is a plan view illustrating the arrangement relationship between a shield electrode and a second routing line illustrated in FIG. 3.
Figure 6B:
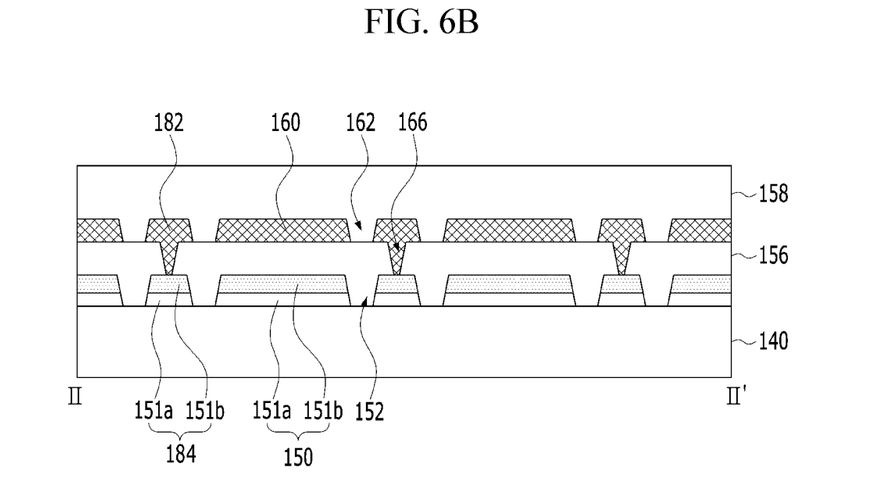
FIG. 6B is a cross-sectional view taken along line II-II' in the display device having a touch sensor illustrated in FIGS. 3 and 4.

Each of the second routing lines 184, as illustrated in FIGS. 5B and 6B, is formed of the same material as the shield electrode 150 on the second inorganic encapsulation layer 146, and is coplanar with the shield electrode 150. Thus, the second routing lines 184, which are formed so as to be surrounded by the shield electrode 150, are disposed so as to be spaced apart from the shield electrode 150, with a second separation hole 152 therebetween. The second separation hole 152 can be formed around substantially all or at least some of the perimeter of a second routing line 184, as shown in FIG. 5B for example.

Figure 6C:
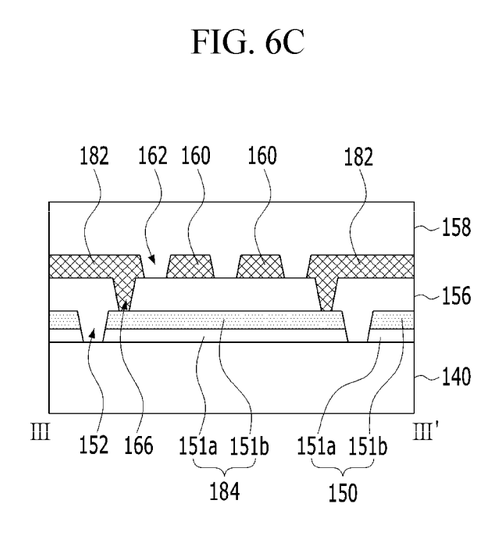
FIG. 6C is a cross-sectional view taken along line III-III' in the display device having a touch sensor illustrated in FIGS. 3 and 4.
Figure 6D:
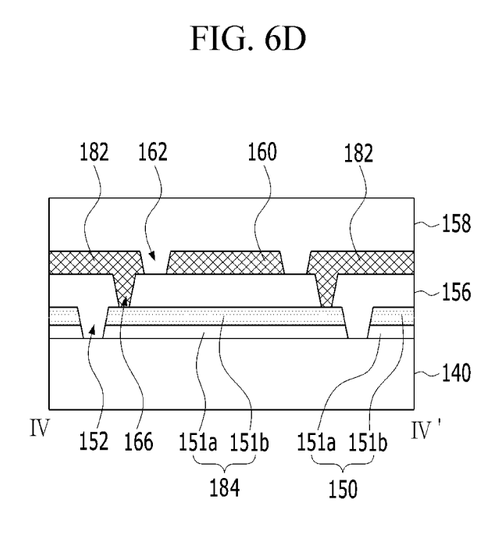
FIG. 6D is a cross-sectional view taken along line IV-IV' in the display device having a touch sensor illustrated in FIG. 4.

In order to connect first routing lines 182 disposed in different touch electrodes 160, as illustrated in FIGS. 6B and 6C, each of the second routing lines 184 is disposed between two adjacent ones of the first routing lines 182 (see FIG. 6C in particular). As illustrated in FIGS. 6B and 6C, each of the second routing lines 184 is exposed through the routing contact holes 166 penetrating the touch insulation film 156, and is electrically connected to the first routing lines 182.

Meanwhile, in the configuration illustrated in FIG. 3, each one of the first routing lines 182 is formed in the region corresponding to a respective one of the touch electrodes 160 so as to overlap the shield electrode 150. Thus, each of the second routing lines 184 is formed between two adjacent ones of the touch electrodes 160 while overlapping two different touch electrodes 160 that are disposed adjacent thereto in the vertical (longitudinal, length) direction. In this case, two routing contact holes 166 are disposed in the regions in which each routing line 180 corresponds to a respective one of the touch electrodes 160. In other words, a first contact hole 166 is disposed in a first region in which a first routing line 182 and a second routing line 184 overlap, and a second contact hole 166 is disposed in a second region in which a different first routing line 182 and the same second routing line 184 overlap, as shown in FIG. 3. In this case, the second routing line 184 corresponds to two different touch electrodes 160 and overlaps two different first routing lines 182. Thus, the first and second routing lines 182 and 184 are electrically connected to each other via two routing contact holes 166 in the regions corresponding to a respective one of the touch electrodes 160.

In the configuration illustrated in FIG. 4, at least two of the first routing lines 182 are formed in the region corresponding to a respective one of the touch electrodes 160 so as to overlap the shield electrode 150. Thus, the second routing lines 184 are disposed not only between two adjacent ones of the touch electrodes 160 but also between the at least two first routing lines 182 in the region corresponding to a respective one of the touch electrodes 160. In other words, a second routing line 184 can be disposed between two different first routing lines 182 on the same touch electrode 160. In this case, at least four routing contact holes 166 are disposed in the regions in which each routing line 180 corresponds to a respective one of the touch electrodes 160. As such, since the number of routing contact holes 166 used for the connection of the first and second routing lines 182 and 184 in the configuration illustrated in FIG. 4 is greater than the number of routing contact holes 166 in the configuration illustrated in FIG. 3, it is possible to prevent defective contact between the first and second routing lines 182 and 184. As the skilled person would understand, the greater the number of routing contact holes 166, the greater the contact area. As such, the electrical contact between the first and second routing lines 182 and 184 has increased stability due to the increased number of routing contact holes 166.

The shield electrode 150 is disposed on the second inorganic encapsulation layer 146, which is formed between the touch electrodes 160 and the cathode 126 of the light-emitting element 126. Here, the shield electrode 150 is formed on the entire surface of the active area so as to overlap the touch electrodes 160, with the touch insulation film 156 interposed therebetween.

The shield electrode 150 is formed in a single-layer or multi-layer structure using a transparent conductive film formed of ITO, IZO, IGZO, or ZnO or using an opaque conductive film formed of metal having high corrosion resistance and acid resistance and excellent conductivity, such as, for example, Ta, Ti, Cu, or Mo, or is formed in a multi-layer structure in which the transparent conductive film 151a and the opaque conductive film 151b are stacked in that order or in the reverse order. When the shield electrode 150 includes the opaque conductive film, the shield electrode 150 is formed in a mesh shape that does not overlap the emission area but overlaps the bank 128, thereby preventing an aperture ratio and transmissivity from being lowered by the shield electrode 150.

During a touch-sensing period, a load free driving signal LFD, which is an alternating-current signal of a voltage having at least one of an amplitude or phase the same as that of the touch-driving signal, is supplied to the shield electrode 150. Thus, because there is no difference in voltage between the shield electrode 150 and the touch electrodes 160, it is possible to minimize parasitic capacitance between the shield electrode 150 and the touch electrodes 160. In addition, the shield electrode 150 can also block noise generated by the electrodes and the signal lines of the display panel.

As illustrated in FIGS. 1 and 2, a touch pad 170 and a shield pad 172 are disposed in the pad area of the substrate 111 that is exposed by, and not covered by, the encapsulation unit 140. The pad area, in which the touch pad 170 and the shield pad 172 are disposed, can be bent and disposed on the rear surface of the active area AA. Thus, the area occupied by the active area is maximized and the area corresponding to the pad area is minimized on the entire screen of the display device.

The touch pad 170 and the shield pad 172 are disposed in the same plane as a display pad, which is connected to at least one of a scan line or a data line of the pixel-driving circuit. For example, each of the touch pad 170, the shield pad 172 and the display pad is disposed on at least one display insulation film of the buffer layer 104, the interlayer insulation film 114, or the planarization film 118, which is disposed between the substrate 111 and the encapsulation unit 140, or on the touch insulation film 156.

The touch pad 170, the shield pad 172 and the display pad are formed so as to be exposed by, and not covered by, a touch protective film 158, and are thus connected to a signal transmission film, on which a touch-driving circuit is installed. The touch protective film 158 is formed to cover the touch electrodes 160, thus preventing the touch electrodes 160 from corroding due to external moisture or the like. The touch protective film 158 is formed in a film or thin-film configuration using an organic insulation material such as epoxy or acryl or using an inorganic insulation material such as SiNx or SiOx.

The touch pad 170 supplies a touch-driving signal to the touch electrodes 160 via the routing lines 180. In addition, the touch pad 170 receives a touch-driving signal, sensed by the touch electrodes 160, via the routing lines 180, and supplies the touch-driving signal to the touch-driving circuit, which is connected with the touch pad 170. The touch-driving circuit determines the presence or absence of a user touch and a touch position by sensing variation in capacitance, which is changed due to a user touch.

Like the touch pad 170, the shield pad 172 is formed in a single-layer or multi-layer structure using metal having high corrosion resistance and acid resistance and excellent conductivity, such as, for example, Ta, Ti, Cu, or Mo. For example, the touch pad 170 is formed in a multi-layer structure, such as Ti/Al/Ti or Mo/Al/Mo, in which metal having high corrosion resistance and acid resistance is disposed at the uppermost layer.

The shield pad 172 is connected to the shield electrode 150 via a shield line 174, which is formed along the side surface of the encapsulation unit 140 as shown in FIG. 1. Thus, during a touch-sensing period, the shield pad 172 supplies a load free driving signal LFD, at least one of the amplitude or the phase of which is the same as that of the touch-driving signal, to the shield line 174. Thus, there is no difference in voltage between the shield electrode 150 and the touch electrodes 160 during a touch-sensing period, and thus it is possible to minimize parasitic capacitance between the shield electrode 150 and the touch electrodes 160, thereby blocking noise that can be generated during a touch-sensing period.

Figure 7:
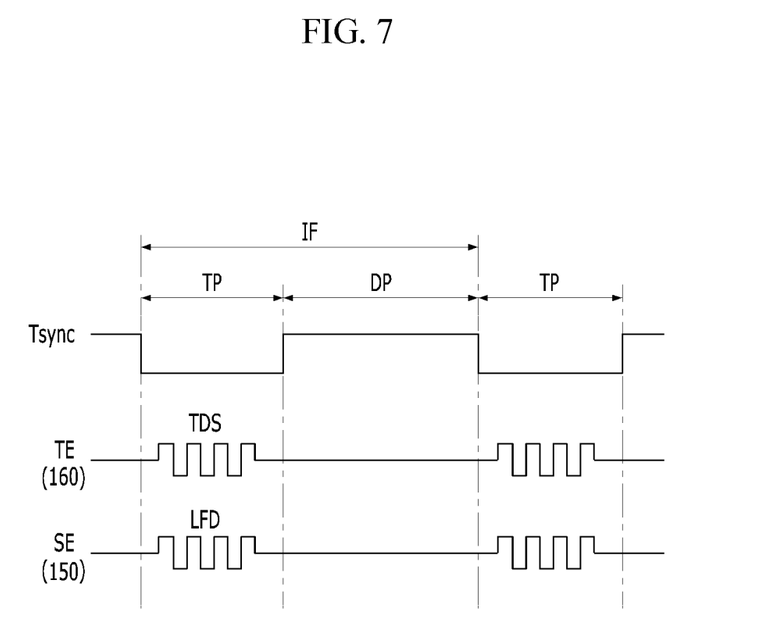
FIG. 7 is a waveform diagram illustrating the signal waveform to be supplied to a touch electrode and a shield electrode in the display device having a touch sensor according to an example of the present invention.

FIG. 7 is a waveform diagram illustrating the signal waveform to be supplied to the touch electrodes and the shield electrode in the display device having a touch sensor according to an example of the present invention.

Referring to FIG. 7, one frame period 1F is time-divided into a display period DP and a touch-sensing period TP. One touch-sensing period TP is allocated between the display periods DP.

During the display period DP, a pixel-driving signal (e.g., a scan signal, a data signal, a low-voltage driving signal, and a high-voltage driving signal) is supplied to each subpixel. Here, the scan signal is the voltage of a gate pulse to be supplied to each scan line. The data signal is the data voltage of an input image to be supplied to each data line during the display period. The low-voltage driving signal is the voltage to be supplied to the cathode of each light-emitting element 120 during the display period DP. The high-voltage driving signal is the voltage to be supplied to the drain electrode of each driving transistor during the display period DP. During the display period DP, the touch electrodes TE or 160 can be switched to a floating state in which no signal is applied thereto or to a state in which a specific voltage (e.g., ground voltage) is applied thereto.

During the touch-sensing period TP, in response to a touch control signal Tsync from a timing controller, the touch-driving circuit supplies a touch-driving signal TDS to the touch electrodes TE or 160, and supplies a load free driving signal LFD, which has the same phase and amplitude as the touch-driving signal TDS to be supplied to the touch electrodes TE or 160, to the shield electrode SE or 150. Thus, it is possible to minimize parasitic capacitance between the touch electrodes TE or 160 and the subpixels, thereby removing touch noise and consequently increasing touch-sensing accuracy.

Although the light-emitting element 120 and the pixel-driving circuit may not be illustrated in FIGS. 6A to 6D, a plurality of light-emitting elements 120 and pixel-driving circuits can be disposed under the encapsulation unit 140, as illustrated in FIG. 2.

As is apparent from the above description, according to one or more embodiments of the present invention, a shield electrode is disposed between a light-emitting element and touch electrodes. While a touch-driving signal is applied to the touch electrodes, a load free driving signal of which at least one of the phase or the amplitude is the same as that of the touch-driving signal is supplied to the shield electrode. As a result, it is possible to remove touch noise and consequently to secure improved touch-sensing performance.

It will be apparent to those skilled in the art that various modifications and variations can be made in the present invention without departing from the scope of the invention. Thus, it is intended that the present invention covers the modifications and variations of this invention provided they come within the scope of the appended claims.

What is claimed is:

1. A display device having a touch sensor, comprising:
   a light-emitting element disposed on a substrate;
   an encapsulation unit disposed on the light-emitting element;
   a plurality of touch electrodes disposed on the encapsulation unit;
   a shield electrode disposed between the light-emitting element and the plurality of touch electrodes; and
   a plurality of routing lines, each of the routing lines being electrically connected to the touch electrodes, the routing lines being disposed along a side surface of the encapsulation unit in a non-active area of the display device,
   wherein, while a touch-driving signal (TDS) is applied to the plurality of touch electrodes, a load free driving signal (LFD) is supplied to the shield electrode,
   wherein at least one of a phase or an amplitude of the load free driving signal (LFD) is substantially the same as a phase or an amplitude of the touch-driving signal (TDS),
   wherein the plurality of routing lines include first routing lines and second routing lines electrically connected to each other via routing contact holes, and
   wherein the routing contact holes comprise a first contact hole and a second contact hole,
   the first contact hole being disposed in a first region in which one of the first routing lines and one of the second routing lines overlap, and the second contact hole being disposed in a second region in which a different one of the first routing lines and the same one of second routing lines overlap.

2. The display device according to claim 1, wherein both the phase and the amplitude of the load free driving signal (LFD) are substantially the same as the phase and the amplitude of the touch-driving signal (TDS).

3. The display device according to claim 1, wherein the shield electrode is disposed on the encapsulation unit,
   wherein each of the touch electrodes comprises a touch sensor overlapping the shield electrode, with a touch insulation film interposed therebetween, and
   wherein the touch insulation film and the plurality of routing lines are both disposed on the side surface and extend to a pad area of the display device.

4. The display device according to claim 1, wherein
   the first routing lines are spaced apart from each other in a longitudinal direction of the routing lines; and
   the second routing lines are disposed between the first routing lines, the second routing lines electrically connecting the first routing lines to each other.

5. The display device according to claim 4, wherein the first routing lines are spaced apart from the plurality of touch electrodes, with first separation holes therebetween, in a same plane as the touch electrodes.

6. The display device according to claim 4, wherein the second routing lines are spaced apart from the shield electrode, with second separation holes therebetween, in a same plane as the shield electrode.

7. The display device according to claim 4, wherein the first routing lines are surrounded by the touch electrodes, and
   wherein the second routing lines are surrounded by the shield electrode.

8. The display device according to claim 4, wherein at least one of the first routing lines is formed in a region corresponding to a respective one of the touch electrodes.

9. The display device according to claim 4, wherein the second routing lines are at least partly disposed between the touch electrodes.

10. The display device according to claim 8, wherein the second routing lines are at least partly disposed between the touch electrodes and between at least two of the first routing lines formed in the region corresponding to a respective one of the touch electrodes.

11. The display device according to claim 9, wherein the second routing lines are at least partly disposed between the touch electrodes and between at least two of the first routing lines formed in the region corresponding to a respective one of the touch electrodes.

12. The display device according to claim 4, wherein the first routing lines and the touch electrode are on a same plane, and
   wherein the second routing lines and the shield electrode are formed on a same plane.

13. The display device according to claim 4,
   wherein the first and second routing contact holes extend through a touch insulation film on the encapsulation unit.

14. The display device according to claim 1, further comprising:
   a shield line disposed along a side surface of the encapsulation unit, the shield line being connected to the shield electrode;

a shield pad connected to the shield line, the shield pad being disposed on a portion of the substrate that not covered by the encapsulation unit; and a touch pad connected to the routing lines, the touch pad being disposed adjacent to the shield pad.

15. The display device according to claim 14, further comprising:

a touch-driving circuit configured to supply the touch-driving signal (TDS) to the touch pad and to supply the load free driving signal (LFD) to the shield pad.

* * * * *